United States Patent [19]
Sykes

[11] 3,992,225
[45] Nov. 16, 1976

[54] PRINTED CIRCUIT BOARD BATTERY PACK

[75] Inventor: John E. Sykes, Dallas, Tex.

[73] Assignee: Mauratron Incorporated, Dallas, Tex.

[22] Filed: Oct. 28, 1975

[21] Appl. No.: 626,135

[52] U.S. Cl. .......................... 429/1; 317/101 CW; 429/9; 429/99
[51] Int. Cl.² ........................................ H01M 2/10
[58] Field of Search .......... 136/173, 181; 339/17 M, 339/17 N, 18 B, 46, 258 A; 317/101 CW

[56] References Cited
UNITED STATES PATENTS

| | | | |
|---|---|---|---|
| 983,760 | 2/1911 | Patterson | 136/173 |
| 1,316,568 | 9/1919 | Koretzky | 136/173 |
| 3,216,089 | 11/1965 | Dettman | 29/626 |
| 3,339,169 | 8/1967 | Freeland | 339/17 |
| 3,553,033 | 1/1971 | Page | 136/132 |
| 3,801,373 | 4/1974 | Spellman | 136/109 |

FOREIGN PATENTS OR APPLICATIONS

| | | | |
|---|---|---|---|
| 229,413 | 2/1925 | United Kingdom | 136/173 |

Primary Examiner—Donald L. Walton
Attorney, Agent, or Firm—Richards, Harris and Medlock

[57] ABSTRACT

A battery pack for batteries of the type having male and female snap connectors mounted at the opposite ends thereof includes at least two printed circuit boards having male and female snap connectors mounted thereon to receive the snap connectors of the batteries. The snap connectors mounted on the circuit boards are positioned to mechanically engage and electrically contact the snap connectors on the batteries while accommodating limited relative movement of the batteries with respect to the circuit boards, whereby the batteries are floatingly supported. The snap connectors on the circuit boards are electrically interconnected and are electrically connected to terminals for the battery pack by printed circuit layers formed on the circuit boards. The printed circuit layers are formed on the opposite sides of the circuit boards from the positioning of the snap connectors, and electrical connections are formed through the circuit boards between the printed circuit layers and the snap connectors by means of fasteners which retain the snap connectors on the circuit boards. Layers of electrically insulative material are formed on the sides of the circuit boards opposite the positioning of the snap connectors thereon and extend over the printed circuit layers.

20 Claims, 9 Drawing Figures

U.S. Patent  Nov. 16, 1976  3,992,225
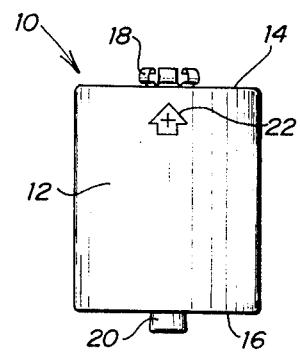
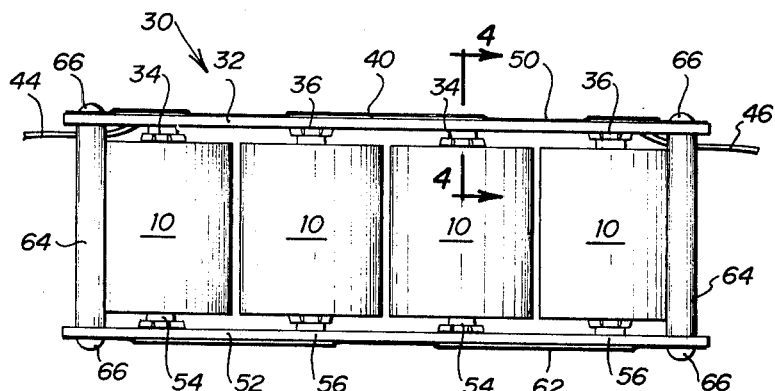
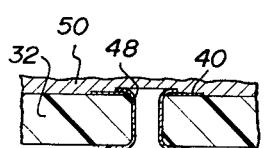
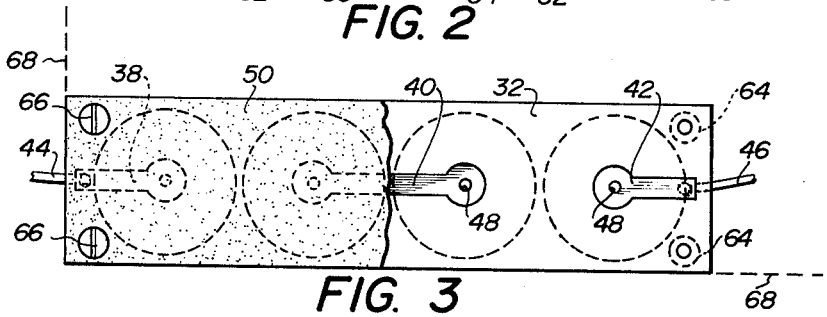
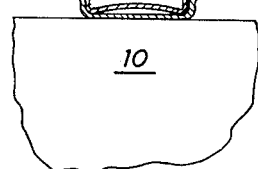
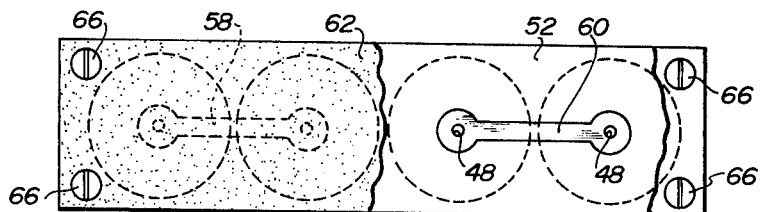
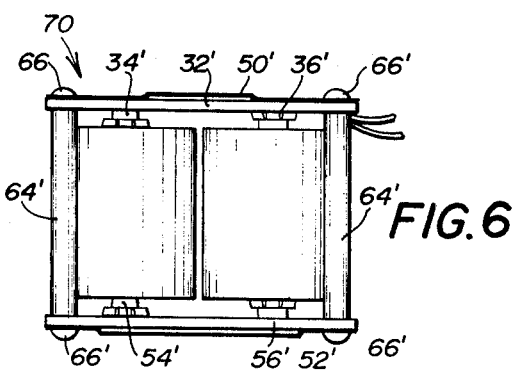
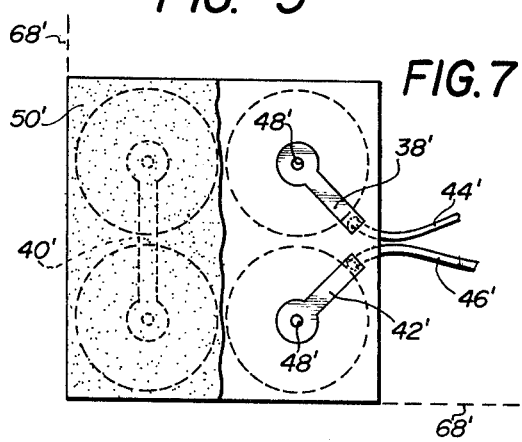
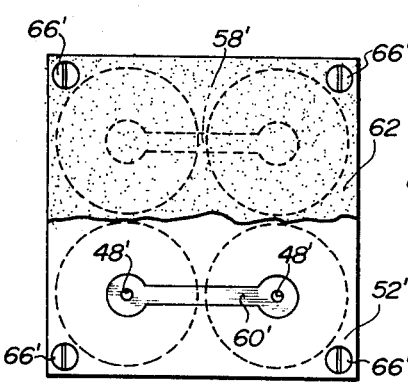
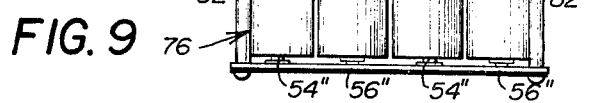

PRINTED CIRCUIT BOARD BATTERY PACK

BACKGROUND AND SUMMARY OF THE INVENTION

This invention relates to printed circuit board battery packs and more particularly to printed circuit board battery packs for use in conjunction with batteries having snap connectors mounted on the opposite ends thereof.

As is well known, various types of modern batteries are provided with terminals in the form of snap connectors. This is highly advantageous particularly in the form of portable or mobile devices, wherein the snap connectors of the batteries serve to prevent disengagement between the battery terminals and associated circuitry. One particular snap connector type battery which has gained relatively widespread commercial success comprises a cylindrical body having male and female snap connectors mounted at the opposite ends thereof.

One difficulty which has been experienced in the use of batteries of this type involves the fact that the battery packs provided for use in conjunction therewith often employ individual snap connectors adapted for mating engagement with the snap connectors of such batteries and having flexible wires extending therefrom. This type of connection to the snap connectors of the batteries does not serve to retain the batteries in any way, whereby the battery pack must be provided with additional structure serving to retain the batteries. As a result, battery packs intended for use with batteries of the type having snap connectors mounted at the opposite ends thereof have typically either been unduly bulky and heavy, or have been flexible in nature and therefore awkward to use in many circumstances. Also, prior art battery packs for use in conjunction with batteries having snap connectors at the opposite ends have typically not provided adequate shock restraint, whereby the connections to the snap connectors of the batteries have often tended to work loose.

The present invention coprises a battery pack which overcomes the foregoing and other difficulties along since associated with the prior art. In accordance with the broader aspects of the invention, a battery pack for batteries of the type having snap connectors mounted at the opposite ends thereof comprises at least two circuit board members having snap connectors mounted thereon for mechanical engagement with and electrical connection to the snap connectors of the batteries. Electrical connections are made between the snap connectors on the circuit boards and to terminals for the battery pack by means of printed circuit layers formed on the circuit boards. The circuit boards are positioned in a spaced apart relationship such that the batteries are retained by the snap connectors on the circuit boards while accommodating limited relative movement between the batteries and the circuit boards, whereby the batteries are floatingly supported and the difficulties that have been experienced with prior art battery packs due to shock loading are eliminated.

In accordance with other aspects of the invention the printed circuit layers are mounted on the opposite sides of the circuit boards from the snap connectors thereon. Fasteners are utilized to retain the snap connectors on the circuit boards and to form electrical connections through the circuit boards to the printed circuit layers. A coating of electrically insulative material is formed on the opposite side of each circuit board from the snap connectors, and extends over the printed circuit layers. A layer of insulative material of a solid nature cut to size may also be used.

In accordance with still other aspects of the invention, the snap connectors and the printed circuit layers of the printed circuit boards are utilized to connect the batteries in series. The battery arrangement may be either linear, in which case the batteries are positioned adjacent one another along a straight line, or rectangular, in which case the batteries are positioned adjacent one another along two or more parallel lines. A circular battery arrangement could also be used. The batteries may also be mounted in a stacked array in which event a circuit board having snap connectors on both sides thereof is positioned between layers of batteries.

DESCRIPTION OF THE DRAWINGS

A more complete understanding of the invention may be had by reference to the following Detailed Description when taken in conjunction with the accompanying Drawings, wherein:

FIG. 1 is an illustration of a conventional battery having snap connectors mounted at the opposite ends thereof;

FIG. 2 is a side view of a battery pack comprising a first embodiment of the invention;

FIG. 3 is a top view of the battery pack of FIG. 2 in which certain parts have been broken away more clearly to illustrate certain features of the invention;

FIG. 4 is an enlarged partial sectional view taken along the line 4—4 of FIG. 2 in the direction of the arrows;

FIG. 5 is a bottom view of the battery pack of FIG. 2 in which certain parts have been broken away;

FIG. 6 is a side view of a battery pack incorporating a second embodiment of the invention;

FIG. 7 is a top view of the battery pack of FIG. 6 in which certain parts have been broken away;

FIG. 8 is a bottom view of the battery pack of FIG. 6 in which certain parts have been broken away; and FIG. 9 is a side view of the battery pack incorporating a third embodiment of the invention.

DETAILED DESCRIPTION

Referring now to the Drawings, and particularly to FIG. 1 thereof, there is shown a conventional battery 10 of the type utilized in the practice of the present invention. The battery 10 comprises a cylindrical body 12 and flat, circular ends 14 and 16. The battery 10 further includes a female snap connector 18 centrally disposed on the end 14 and defining a first terminal of the battery 10, and a male snap connector 20 centrally disposed on the end 16 and defining a second terminal of the battery 10. The battery 10 may further include indicia of terminal polarity 22, which may be of any of the various well known types.

In FIGS. 2, 3 and 5, there is shown a battery pack 30 comprising a first embodiment of the invention. The particular battery pack 30 shown in these Figures is utilized to receive and form electrical connections to four batteries 10 of the type shown in FIG. 1. However, as will become more apparent hereinafter, battery packs incorporating the first embodiment of the invention may be utilized in conjunction with any desired number of batteries 10.

The battery pack 30 includes a circuit board 32 comprising a thin, flat, substantially planar member formed from a dimensionally stable, electrically insulative material. The circuit board 32 may be formed in accordance with any of the various conventional techniques which are utilized in the electronic components manufacturing industry in the manufacture of printed circuit boards.

A plurality of male snap connectors 34 and a plurality of female snap connectors 36 are mounted on the circuit board 32. All of the snap connectors 34 and 36 are mounted on the same side of the circuit board 32, and are spaced predetermined distances apart, with the male and female snap connectors being alternately arranged. The snap connectors 34 and 36 are adapted to mechanically engage and form electrical contact with the female snap connectors 18 and the male snap connectors 20 of the batteries 10, respectively. In accordance with the first embodiment of the invention the snap connectors 34 and 36 of the circuit board 32 are positioned at spaced points along a straight line, whereby the first embodiment of the invention may be considered as a linear battery pack.

As is best shown in FIG. 3, the circuit board 32 has a plurality of printed circuit layers 38, 40 and 42 formed thereon. The printed circuit layers 38, 40 and 42 may be formed on the circuit board 32 by means of any of the various techniques conventionally employed in the electronic components manufacturing industry in the manufacture of printed circuit boards.

The printed circuit layer 38 is connected to one of the male snap connectors 34 of the printed circuit board 32 and defines a terminal for the battery pack 30. A flexible lead 44 comprising a length of conventional insulated wire is connected to the printed circuit layer 38 by conventional means, such as a solder connection between the conductive portion of the wire and the printed circuit layer. The lead 44 extends from the printed circuit layer 38 through a hole formed in the circuit board 32 and hence into electrical contact with remote circuitry.

The printed circuit layer 42 also defines a terminal of the battery pack 30. The printed circuit layer 42 is electrically connected to one of the female snap connectors 36 of the circuit board 32 and is in turn electrically connected to a flexible lead 46. The lead 46 extends from the printed circuit layer 42 through a hole in the circuit board 32 and into electrical contact with remote circuitry.

Unlike the printed circuit layers 38 and 42, the printed circuit layer 40 does not serve as a terminal for the battery pack 30. Rather, the printed circuit layer 40 serves to electrically interconnect the male snap connector 34 and the female snap connector 36 which are not connected to the printed circuit layers 38 and 42. As will become more apparent hereinafter, similar connections are formed between the terminals of the batteries 10 situated remotely from the circuit board 32. In this manner the battery pack 30 functions to contact all of the batteries 10 received therein in series electrically.

The printed circuit layers 38, 40 and 42 are each electrically connected to the underlying snap connectors by means of rivets 48. Referring particularly to FIG. 4, the rivets 48 form electrical connections extending through the circuit board 30 whereby the printed circuit layers on one side thereof and the snap connectors on the opposite sides thereof are electrically interconnected. The rivets 48 also serve to secure the snap connectors to the circuit board 32.

Referring again to FIGS. 2 and 3, a layer 50 of electrically insulative material is formed on the same side of the circuit board 32 as the printed circuit layers 38, 40 and 42. The layer 50 preferably extends over the entire surface of the circuit board 32 remote from the positioning of the snap connectors thereon, and serves to electrically isolate the printed circuit layers 38, 40 and 42. The layer 50 may be formed from any of the various materials commonly employed as electrically insulative layers in the electronic components manufacturing industry. For example, the layer 50 may comprise polyethylene or any similar plastic material.

As is best shown in FIGS. 2 and 5, the battery pack 30 further comprises a circuit board 52. Like the circuit board 32, the circuit board 52 preferably comprises a thin, flat, planar member formed from a dimensionally stable, electrically insulative material. The circuit board 52 may be manufactured utilizing any of the techniques commonly employed in the electronic components manufacturing industry in the manufacture of printed circuit boards.

The circuit board 52 has a plurality of female snap connectors 54 and a plurality of male snap connectors 56 mounted thereon. The female snap connectors 54 are adapted to mechanically engage and form electrical contacts with the male snap connectors 20 of the batteries 10, and the male snap connectors 56 are adapted to mechanically engage and form electrical contacts with the female snap connectors 18 of the batteries 10. The snap connectors 54 and 56 are all mounted on the same side of the circuit board 52 and are positioned in a predetermined spaced apart relationship which is identical to the spacing relationship of the snap connectors 34 and 36 of the circuit board 32.

Each of the female snap connectors 54 on the circuit board 52 faces and is positioned in alignment with one of the male snap connectors 34 on the circuit board 32. Likewise, each of the male snap connectors 56 on the circuit board 52 faces and is in alignment with one of the female snap connectors of the circuit boards 32 and 52 are adapted to receive and retain the batteries 10 therebetween by engagement with the snap connectors 18 and 20 of the batteries.

As is best shown in FIG. 5, the circuit board 52 has a pair of printed circuit layers 58 and 60 formed on the side thereof opposite the positioning of the snap connectors 54 and 56. The printed circuit layers 58 and 60 of the circuit 52 may be formed by means of the techniques conventionally employed in the electric components manufacturing industry in the manufacture of printed circuit boards.

The printed circuit layer 58 serves to electrically interconnect the left-hand female snap connector 54 and the left-hand male snap connector 56 (FIG. 2) of the battery pack 30. The printed circuit layer 60 serves to electrically interconnect the right-hand female snap connector 54 and the right-hand male snap connector 56 (FIG. 1) of the battery pack 30. It will thus be understood that by means of the printed circuit layer 38 on the printed circuit board 32, the male snap connector 34 electrically connected thereto, the aligned female snap connector 54 on the circuit board 52, the printed circuit layer 58, the male snap connector 56 connected thereto, the aligned female snap connector 36 on the circuit board 52, the printed circuit layer 40, the male snap connector 34 connected thereto, the aligned female snap connector 54 on the circuit board 52, the printed circuit layer 60, the male snap connector 56 connected thereto, the aligned female snap connector 36 on the circuit board 32 and the printed circuit layer 42, all of the batteries 10 which are received in the battery pack 30 are connected in series electrically and serve to establish a predetermined electrical potential across the terminals comprising the printed circuit layers 38 and 42.

A layer of electrically insulative material 62 is formed on the side of the circuit board 52 having the printed circuit layers 58 and 60 formed thereon. The insulative layer 62 is thus disposed on the side of the circuit board 52 remote from the mounting of the snap connectors 54 and 56, and serves to ellectrically isolate the printed circuit layers 58 and 60. The layer 62 may be formed from any of the materials commonly employed in the electronic components manufacturing industry to form insulative layers. For example, the layer 62 may be formed from polyethylene or similar plastic materials.

Referring again to FIG. 2, the circuit boards 32 and 52 are maintained in a predetermined spacial relationship by means of a plurality of spacers 64. The spacers 64 engage the engage sufaces of the circuit boards 32 and 52 having the snap connectors 34, 36, 54, and 56 mounted thereon, and thereby maintain a predetermined spacial relationship between aligned snap connectors. The circuit boards 32 and 52 are retained in engagement with the spacers 64 by means of a plurality of fasteners 66. Aligned fasteners 66 may extend through the spacers 64 into threaded engagement with one another. Alternatively, the fasteners 66 may be threadedly engaged directly with the spacers 64.

The spacial relationship between the circuit boards 32 and 52 is such that the batteries 10 are retained in the battery pack 30 by means of mechanical engagement between the snap connectors of the batteries and the snap connectors of the circuit boards. Thus, the snap connectors of the batteries are continuously maintained in mechanical engagement with and electrical contact with the snap connectors of the circuit boards. However, at least a limited amount of relative movement of the batteries 10 with respect to the circuit boards 32 and 52 is permitted, whereby the batteries 10 are floatingly supported in the battery pack 30. This has been found to be highly advantageous in preventing damage to the component parts of the battery pack due to shock loads. Likewise, the snap connectors of the batteries 10 do not become disengaged from the snap connectors of the circuit boards 32 and 52 even under conditions of extremely heavy shock loading.

Referring particularly to FIG. 3, it will be understood that whereas the first embodiment of the invention has been illustrated and described in conjunction with a battery pack adapted to receive four batteries 10, battery packs incorporating the first embodiment of the invention may be constructed so as to receive any desired number of batteries. Thus, as is illustrated by the perpendicular dashed lines 68, the battery pack 30 may be expanded either lengthwise or widthwise to accommodate a greater number of batteries, it being understood that in the case of a widthwise expansion the battery pack would no longer comprise a purely linear battery array. Conversely, the battery pack 30 may be reduced in length so as to accommodate a lesser number of batteries, if desired. It will be further understood that the battery pack 30 may be arranged to accommodate any of the various conventional battery sizes including D, half D, and F, all of which are of the same diameter; C and others of the same diameter; A, AA, and several other sizes of the same diameter, etc.

Refering to FIGS. 6, 7 and 8, there is shown a battery pack 70 incorporating a second embodiment of the invention. Many of the component parts of the battery pack 70 are substantially identical in construction and function to component parts of the battery pack 30 as illustrated in FIGS. 2, 3, 4 and 5. Such identical component parts are designated in FIGS. 6, 7 and 8 with the same reference numerals utilized hereinbefore in conjunction with the description of the battery pack 30, but are differentiated therefrom by means of a prime (') designation.

The battery pack 70 differs from the battery pack 30 primarily in the fact that whereas the battery pack 30 is linear in nature, the battery pack 70 may be considered as rectangular in nature. That is, rather than being disposed along a single straight line, the batteries 10, the various snap connectors and the associated component parts of the battery pack 70 are disposed along at least two parallel lines. It will be appreciated that a rectangular battery pack is shorter than, but is correspondingly wider than, a linear battery pack having the same capacity.

Refering particularly to FIG. 7, the capacity of the battery pack 70 may be expended in either or both of two perpendicular directions as indicated by the dashed lines 68'. It will be understood that if the capacity of the battery pack 70 is expanded in one of these two directions in favor of the other, the configuration of the battery pack will tend to become more linear as opposed to the square configuration of FIG. 7. It will be further understood that the battery pack 70 may be configured to accept batteries having any of the various standard battery dimensions, including D, half D, F, C, A, AA, etc.

In FIG. 9 there is shown a battery pack 72 incorporating a third embodiment of the invention. Many of the component parts of the battery pack 72 are substantially identical in construction and function to component parts of the battery pack 30 as shown in FIGS. 2, 3, 4 and 5. Such identical component parts are designated in FIG. 9 with the same reference numerals utilized in the description of the battery pack 30, but are differentiated therefrom by means of a double prime (") designation.

The battery pack 72 differs from the battery pack 30 primarily with respect to the fact that the battery pack 72 incorporates stacked layers 74 and 76, each incorporating a plurality of batteries 10. A third circuit board 78 is disposed between the two layers of batteries 74 and 76. The circuit board is preferably constructed from a dimensionally stable, electrically insulative material, and may be substantially identical to the circuit boards 32" and 52".

The circuit board 78 has a plurality of female snap connectors 80 and a plurality of male snap connectors 82 mounted thereon. Certain of the female snap connectors 80 are mounted on one side of the circuit board 78 in alignment with the male snap connectors 34" of the circuit board 32", and the remainder of the female snap connectors 80 are mounted on the opposite sides of the circuit board 78 in alignment with the male snap connectors 56" on the circuit board 52". Likewise, certain of the male snap connectors 82 are mounted on one side of the circuit board 78 in alignment with the female snap connectors 36"]of the circuit board 32", and the remainder of the male snap connectors 82 are mounted on the opposite side of the circuit board 78 in alignment with the female snap connectors 54" of the circuit board 52". Like the various snap connnectors of the battery pack 30, all of the snap connectors comprising the battery pack 72 are adapted to receive and retain the snap connectors 18 and 20 of the batteries 10 therein.

The snap connectors 80 and 82 on the circuit board 78 may be positioned opposite one another and secured and electrically interconnected by rivets similar to the rivets 48 but passing through two snap connectors. Alternatively, the snap connectors 80 and 82 may be positioned in spaced apart relationships and secured by individual rivets similar to the rivets 48. In the latter case corresponding snap connectors 80 and 82 are electrically interconnected, preferably by means of a printed circuit layer formed on the circuit board 78. It will be appreciated that such an arrangement also necessitates the positioning of each of the snap connectors 34", 36", 54" and 56" in alignment with an appropriate snap connector 80 or 82.

The battery pack 72 incorporates substantially all of the advantages of the battery packs 30 and 70. Additionally, the battery pack 72 provides the advantage of accommodating a number of batteries in a stacked array. This is highly advantageous in certain applications in which spacial and/or other considerations may negate the use of other battery pack arrays incorporating the invention.

A modified version of the third embodiment of the invention also comprises stacked layers such as the layers 74 and 76, but omits the circuit board therebetween. Instead, the batteries are secured together such as by welding. The battery pack is otherwise arranged the same as the battery pack 72.

From the foregoing it will be understood that the use of the present invention incorporates numerous advantages over the prior art. Perhaps most importantly, by means of the invention there is provided a battery pack for batteries of the type having snap connectors mounted at the opposite ends thereof which is substantially rigid in nature while simultaneously eliminating the bulkiness and awkwardness which have characterized prior art battery packs. Another advantage deriving from the use of the invention involves the fact that the batteries are securely retained in the battery pack and yet are floatingly supported, whereby the battery pack is not damaged and the batteries do not become disengaged therefrom even under conditions of extreme shock loading. Other advantages deriving from the use of the invention will readily suggest themselves to those skilled in the art.

Although preferred embodiments of the invention have been illustrated in the accompanying Drawings and described in the foregoing Detailed Description, it will be understood that the invention is not limited to the embodiments disclosed, but is capable of numerous rearrangements, modifications, and substitutions of parts and elements without departing from the spirit of the invention.

What is claimed is:

1. In combination with a plurality of batteries of the type having male and female snap connectors mounted at their opposite ends, the improvement comprising:

first circuit board means comprising a substantially flat, planar member formed from a dimensionally stable, electrically insulative material;

at least one male snap connector mounted on one side of the first circuit board means for engagement with a female snap connector of one of the batteries to form an electrical connection therewith;

at least one female snap connector mounted on the same side of the first circuit board means for engagement with a male snap connector of one of the batteries to form an electrical connection therewith;

printed circuit means formed on the first circuit board means and electrically interconnecting the male and female snap connectors mounted thereon;

a layer of electrically insulative material formed on the side of the first circuit board means having the printed circuit means thereon and extending over the printed circuit means;

second circuit board means comprising a substantially flat, planar member formed from a dimensionally stable, electrically insulative material;

at least one male snap connector mounted at one side of the second circuit board means for engagement with a female snap connector of one of the batteries to form an electrical connection therewith;

at least one female snap connector mounted on the same side of the first circuit board means for engagement with a male snap connector of one of the batteries to form an electrical connection therewith;

printed circuit means formed on the second circuit board means and forming electrical terminals extending to the male and female snap connectors mounted thereon;

a layer of electrically insulative material formed on the side of the second circuit board means having the printed circuit means thereon and extending over the printed circuit means; and means positioning the first and second circuit board means in a spaced apart relationship to receive the batteries therebetween with the male snap connector of the first circuit board means facing and aligned with the female snap connector of the second circuit board means and with the female snap connector of the first circuit board means facing and aligned with the male snap connector of the second circuit board means.

2. The improvement according to claim 1 further characterized by means positioning the first and second circuit board means in a predetermined spaced apart relationship whereby the snap connectors mounted thereon mechanically engage the snap connectors of the batteries to form electrical connections therewith while permitting at least a predetermined amount of relative movement between the batteries and the circuit board means whereby the batteries are floatingly supported in the snap connectors of the circuit board means.

3. The improvement according to claim 2 wherein the printed circuit means are formed on the opposite sides of the circuit board means from the mounting of the snap connectors thereon, and further including means forming an electrical connection through the circuit board means between the snap connectors mounted thereon and the printed circuit means.

4. A battery pack comprising:

first and second circuit board means each comprising a flat, thin member formed from a dimensionally stable, electrically insulative material;

at least one male snap connector and at least one female snap connector mounted on one of the circuit board means on the same side thereof and positioned a predetermined distance apart;

printed circuit means formed on the other circuit board means and defining electrical terminals extending to the male and female snap connectors mounted thereon;

layers of electrically insulative material formed on the circuit board means and extending over the printed circuit means;

means positioning the circuit board means in a predetermined spaced apart relationship with the male and female snap connectors on said one of the circuit board means aligned with and facing the female and male snap connectors on said other circuit board means, respectively; and at least two batteries each having a male snap connector at one end and a female snap connector at the other end;

the snap connectors of the batteries being mechanically engaged with the snap connectors of the circuit board means and electrically connected thereto whereby the batteries are retained between the circuit board means and an electrical potential is established between the terminals comprising the printed circuit means on the circuit board means.

5. The battery pack according to claim 4 wherein the snap connectors on the circuit board means are positioned to permit limited relative movement between the batteries and the circuit board means whereby the batteries are floatingly supported.

6. The battery pack according to claim 4 wherein the printed circuit means are formed on the opposite side of the circuit board means from the positioning of the snap connectors thereon.

7. The battery pack according to claim 6 further characterized by fastener means for securing the snap fasteners to the circuit board means and forming electrical connections through the circuit board means to the printed circuit means formed thereon.

8. A battery pack comprising:

first and second circuit board means each comprising substantially thin, flat member formed from a dimensionally stable, electrically insulative material;

the first circuit board means having at least two male snap connectors and at least two female snap connectors mounted on the same side thereof and in a predetermined array;

the second circuit board means having at least two male snap connectors and at least two female snap connectors mounted on the same side thereof and in the same predetermined array as the arrangement of the snap connectors on the first circuit board means;

printed circuit means formed on the first circuit board means and electrically connecting a first male snap connector to a first female snap connector and a second male snap connector to a second female snap connector, respectively;

printed circuit means formed on the second circuit board means and electrically connecting a first male snap connector to a first female snap connector, said printed circuit means on the second circuit board means also forming terminals electrically connected to a second male snap connector and a second female snap connector thereon;

layers of electrically insulative material formed on the first and second circuit board means and extending over the printed circuit means thereon;

means positioning the first and second circuit boards in a predetermined facial relationship with the male snap connectors on the first circuit board means aligned with the female snap connectors on the second circuit board means and with the female snap connectors on the first circuit board means aligned with the male snap connectors on the second circuit board means, respectively; and at least four batteries each having male and female snap connectors mounted at the opposite ends thereof;

said batteries being mounted between the first and second circuit board means with the snap connectors of the batteries mechanically engaged with and in electrical contact with the snap connectors mounted on the circuit board means.

9. The battery pack according to claim 8 wherein the snap connectors and the batteries define a linear array wherein the batteries are positioned adjacent one another along a single, substantially straight line.

10. The battery pack according to claim 8 wherein the snap connectors and the batteries define a rectangular array wherein at least two batteries are positioned adjacent one another along at least two substantially parallel lines.

11. The battery pack according to claim 8 wherein the printed circuit means are formed on the opposite sides of the circuit board means from the positioning of the snap connectors thereon, and further including means forming electrical connections extending through the circuit board means between the snap connectors and the printed circuit means.

12. The battery pack according to claim 11 wherein the means forming electrical connections extending through the circuit board means comprising fastener means for securing the snap connectors to the circuit board means.

13. The battery pack according to claim 8 wherein the circuit board means are positioned to retain the snap connectors thereon in mechanical engagement and electrical contact with the snap connectors on the batteries while permitting limited movement of the batteries relative to the circuit board means so that the batteries are floatingly supported.

14. The battery pack according to claim 13 wherein the circuit board means positioning means comprises spacer members extending between the circuit board means to maintain the predetermined positioning therebetween and fastener means for retaining the circuit board means in engagement with the spacer members.

15. A battery pack comprising:

first circuit board means comprising a flat, planar member formed from a dimensionally stable, electrical conductive material;

at least one male snap connector and at least one female snap connector mounted on the same side of the first circuit board means and in a predetermined spaced apart relationship;

printed circuit means forming an electrical connection between the male snap connector and the female snap connector on the first circuit board means;

second circuit board means comprising a flat, planar member formed from a dimensionally stable, electrical insulative material;

first male and first female snap connectors mounted on the same side of the second circuit board means and in the same predetermined spaced apart relationship as the snap connectors of the first circuit board means;

means positioning the first and second circuit board means in a predetermined spaced apart relationship with the first male snap connector of the second circuit board means facing and aligned with the female snap connector of the first circuit board means and with the first female snap connector of the second circuit board means facing and aligned with the male snap connector of the first circuit board means, respectively;

a first pair of batteries of the type having male and female snap connectors mounted on opposite ends thereof;

said first pair of batteries being positioned between the first and second circuit board means with the snap connectors at the opposite ends thereof mechanically engaged by and in electrical contact with the snap connectors of the circuit board means;

second male and second female snap connectors mounted on the opposite side of the circuit board means from the positioning of the first male and first female snap connectors thereon and being positioned in a predetermined spaced apart relationship;

third circuit board means comprising a substantially flat, planar member formed from a dimensionally stable, electrically insulative material;

male and female snap connectors mounted on the same side of the third circuit board means and positioned in the same predetermined spaced apart relationship as the second male and second female snap connectors of the second circuit board means;

printed circuit means formed on the third circuit board means and extending into electrical contact with the male and female snap connectors thereon to form electrical terminals extending thereto;

means positioning the third circuit board means in a predetermined spaced apart relationship with respect to the second circuit board means with the male snap connector of the third circuit means facing and aligned with the second female snap connector of the second circuit board means and with the female snap connector of the third circuit board means facing and aligned with the second male snap connector of the second circuit board means, respectively;

a second pair of batteries of the type having male and female snap connectors mounted on the opposite ends thereof;

the second pair of batteries being received between the second and third circuit board means with the snap connectors at the opposite ends thereof mechanically engaged by and in electrical contact with the snap connectors of the circuit board means.

16. The battery pack according to claim 15 wherein the printed circuit means are formed on the opposite sides of the circuit board means from the positioning of the snap connectors thereon, and further including means forming electrical connections extending through the circuit board means between the snap connectors and the printed circuit means.

17. The battery pack according to claim 16 wherein the means forming electrical connections extending through the circuit board means comprises fastener means for securing the snap connectors to the circuit board means.

18. The battery pack according to claim 17 wherein each of the first and third circuit board means has a layer of electrically insulative material formed on the side thereof opposite the positioning of the snap connectors and overlying the printed circuit means.

19. The battery pack according to claim 15 wherein the circuit board means are positioned to retain the snap connectors thereon in mechanical engagement and electrical contact with the snap connectors on the batteries while permitting limited movement of the batteries relative to the circuit board means so that the batteries are floatingly supported.

20. The battery pack according to claim 19 wherein the circuit board means positioning means comprises spacer members extending between the circuit board means to maintain the predetermined positioning therebetween and fastener means foor retaining the circuit board means in engagement with the spacer members.

* * * * *

UNITED STATES PATENT OFFICE
CERTIFICATE OF CORRECTION

Patent No. 3,992,225   Dated November 16, 1976

Inventor(s)  John E. Sykes

It is certified that error appears in the above-identified patent and that said Letters Patent are hereby corrected as shown below:

Column 1, line 42  "coprises" should be --comprises--;
Column 1, line 43  "along" should be --long--;
Column 4, line 42  "connectors of the circuit boards 32 and" should be --connectors 36 on the circuit board 32. In this manner the snap connectors of the circuit boards 32 and--;
Column 6, line 5   "Refering" should be --Referring--;
Column 6, line 27  "Refering" should be --Referring--;
Column 7, line 1   "36"]of" should be --36" of--;
Column 7, line 22  "necesitates" should be --necessitates--;
Column 9, after line 7 and before line 8, insert:
    --printed circuit means forming an electrical connection between the male and female snap connectors on said one of the circuit board means;
    at least one male and at least one female snap connector mounted on the other circuit board means on the same side thereof and positioned the same predetermined distance apart;--;
Column 12, line 45  "foor" should be --for--.

Signed and Sealed this nineteenth Day of July 1977

[SEAL]

Attest:

RUTH C. MASON
*Attesting Officer*

C. MARSHALL DANN
*Commissioner of Patents and Trademarks*